US009500797B2

(12) United States Patent
Sato et al.

(10) Patent No.: US 9,500,797 B2
(45) Date of Patent: Nov. 22, 2016

(54) MICROLENS ARRAY, LIGHT INTENSITY DISTRIBUTION UNIFORMIZING ELEMENT HAVING SAME, AND PROJECTION APPARATUS HAVING LIGHT INTENSITY DISTRIBUTION UNIFORMIZING ELEMENT

(71) Applicant: CASIO COMPUTER CO., LTD., Shibuya-ku, Tokyo (JP)

(72) Inventors: Makoto Sato, Tachikawa (JP); Hideki Nakamura, Hamura (JP); Hiroshi Ogino, Higashimurayama (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 212 days.

(21) Appl. No.: 14/107,997

(22) Filed: Dec. 16, 2013

(65) Prior Publication Data

US 2014/0168615 A1   Jun. 19, 2014

(30) Foreign Application Priority Data

Dec. 19, 2012 (JP) .................................. 2012-276802

(51) Int. Cl.

| G03B 21/14 | (2006.01) |
|---|---|
| F21V 8/00 | (2006.01) |
| G02B 3/00 | (2006.01) |
| G03B 21/602 | (2014.01) |
| G02B 27/22 | (2006.01) |
| H01L 27/146 | (2006.01) |
| G03B 21/20 | (2006.01) |

(52) U.S. Cl.
CPC .................. *G02B 6/003* (2013.01); *G02B 3/00* (2013.01); *G02B 3/005* (2013.01); *G02B 27/2214* (2013.01); *G03B 21/14* (2013.01); *G03B 21/208* (2013.01); *G03B 21/602* (2013.01); *H01L 27/14627* (2013.01)

(58) Field of Classification Search
CPC ...... G03B 21/14; G03B 21/602; G02B 3/00; G02B 3/005; G02B 6/003; G02B 27/2214; H01L 27/14627
See application file for complete search history.

(56) References Cited

U.S. PATENT DOCUMENTS

| 8,562,141 | B2 | 10/2013 | Ogino | |
|---|---|---|---|---|
| 9,116,271 | B2 | 8/2015 | Tajiri | |
| 2003/0001986 | A1* | 1/2003 | Fukuda | ............. G02F 1/133528 349/95 |

(Continued)

FOREIGN PATENT DOCUMENTS

| JP | 06-250002 A | 9/1994 |
|---|---|---|
| JP | 10332906 A | 12/1998 |

(Continued)

OTHER PUBLICATIONS

Chinese Office Action (and English translation thereof) dated Feb. 28, 2015, issued in counterpart Chinese Application No. 201310704019.X.

(Continued)

*Primary Examiner* — Sultan Chowdhury
*Assistant Examiner* — Magda Cruz
(74) *Attorney, Agent, or Firm* — Holtz, Holtz & Volek PC

(57) ABSTRACT

The present invention provides a microlens array including multiple microlenses arranged axially parallel to one another, wherein entrance surfaces of the microlenses on which light is incident are made of resin, and exit surfaces of the microlenses from which light exits are made of glass.

7 Claims, 5 Drawing Sheets

(56) References Cited

U.S. PATENT DOCUMENTS

| | | | |
|---|---|---|---|
| 2005/0270645 A1* | 12/2005 | Cossairt | G02B 27/0087 359/463 |
| 2008/0232762 A1 | 9/2008 | Kuramoto et al. | |
| 2013/0063671 A1 | 3/2013 | Yun et al. | |

FOREIGN PATENT DOCUMENTS

| | | |
|---|---|---|
| JP | 2009047952 A | 3/2009 |
| JP | 4912146 B2 | 4/2012 |
| JP | 2012189708 | 10/2012 |
| JP | 2012203366 | 10/2012 |
| TW | 201207547 A | 2/2012 |

OTHER PUBLICATIONS

Japanese Office Action (and English translation thereof) dated Sep. 6, 2016, issued in counterpart Japanese Application No. 2012-276802.

* cited by examiner ns are larger.
MICROLENS ARRAY, LIGHT INTENSITY DISTRIBUTION UNIFORMIZING ELEMENT HAVING SAME, AND PROJECTION APPARATUS HAVING LIGHT INTENSITY DISTRIBUTION UNIFORMIZING ELEMENT

CROSS-REFERENCE TO RELATED APPLICATIONS

The entire disclosure including the specification, claims, drawings and abstract of Japanese Patent Application No. 2012-276802 filed on Dec. 19, 2012 is incorporated herein by reference.

BACKGROUND OF THE INVENTION

1. Field of the Invention

The present invention relates to a microlens array, a light intensity distribution uniformizing element having the same, and a projection apparatus including the light intensity distribution uniformizing element.

2. Description of the Related Art

Microlens arrays in which a large number of microlenses are arranged one-dimensionally or two dimensionally are known. For example, Japanese Patent Application Laid-Open No. 6-250002 discloses a method of manufacturing such microlens arrays. More specifically, a method of manufacturing microlens arrays by using optical patterning and dry etching is disclosed. With the microlenses, a light intensity distribution uniformizing element that uniformizes light intensity distribution can be formed, for example.

In formation of a microlens array with glass, for example, it is difficult to form the entire surfaces of microlenses constituting the microlens array into an ideal lens shape owing to the required processing accuracy. In particular, it is difficult to form an ideal lens shape around boundaries between adjacent microlenses. Portions that are not in the ideal lens shape are ineffective portions that do not function as desirable lenses. The presence of the ineffective portions causes optical loss. The optical loss is greater as the ineffective portions are larger.

Use of resin, for example, facilitates more accurate formation of microlens arrays than using glass. Resin, however, is more susceptible to thermal degradation than glass, for example.

An object of the present invention is to provide a microlens array with reduced optical loss and less susceptible to degradation, a light intensity distribution uniformizing element having the same, and a projection apparatus including the light intensity distribution uniformizing element.

SUMMARY OF THE INVENTION

According to an aspect of the present invention, there is provided a microlens array including multiple microlenses arranged axially parallel to one another, wherein entrance surfaces of the microlenses on which light is incident are made of resin, and exit surfaces of the microlenses from which light exits are made of glass.

BRIEF DESCRIPTION OF THE DRAWINGS

The aforementioned object and further objects, features and advantages of the invention will become further apparent from the following detailed description as well as the accompanying drawings, in which.

DETAILED DESCRIPTION OF THE PREFERRED EMBODIMENT

Hereinafter, a best mode for carrying out the invention will be described by reference to the drawings. Although embodiments that will be described below involve various technical limitations which are preferred in carrying out the invention, the scope of invention is not at all limited to the following embodiments and illustrations made therein.

First Embodiment

Figure 1:
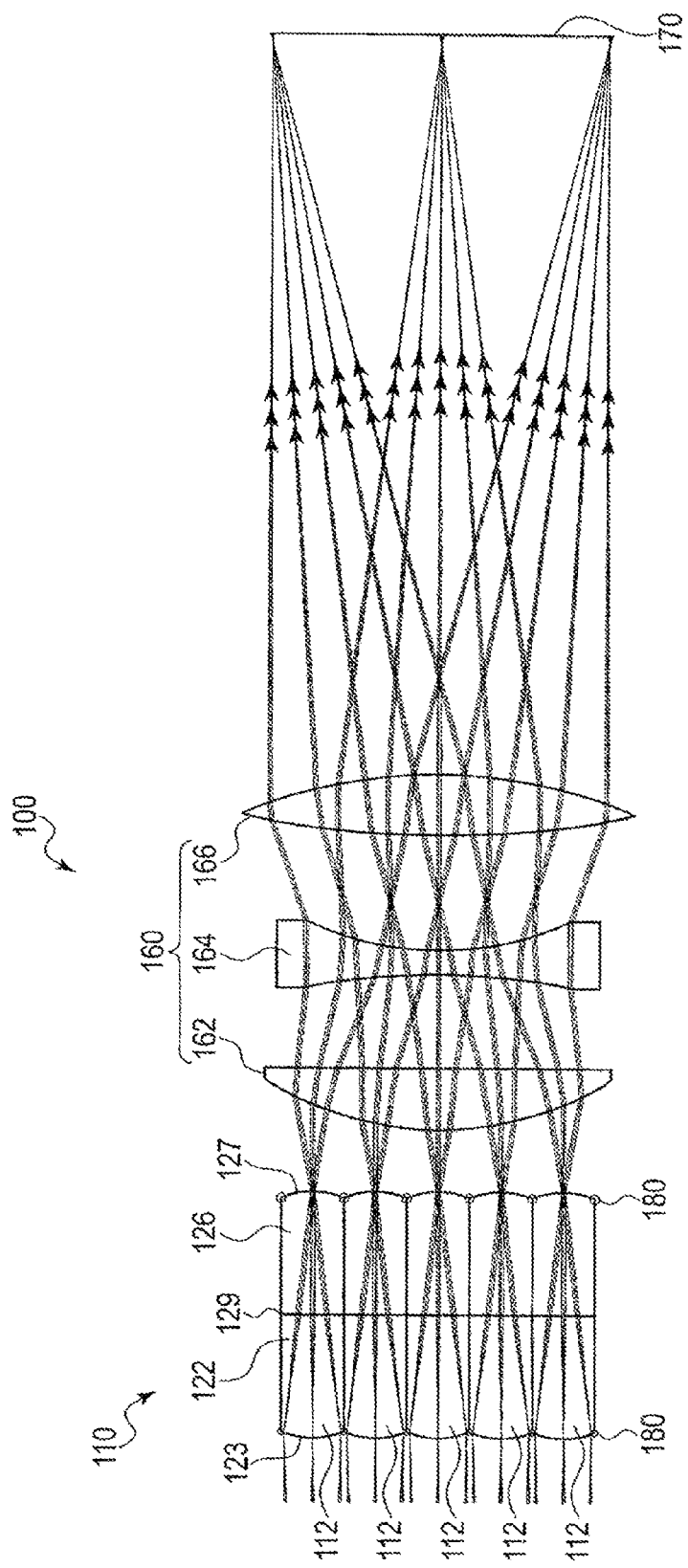
FIG. 1 is a schematic view of an example structure of a light intensity distribution uniformizing element according to a first embodiment.

A first embodiment of the invention will be described with reference to the drawings. FIG. 1 illustrates an outline of an example structure of a light intensity distribution uniformizing element 100 according to the present embodiment. The light intensity distribution uniformizing element 100 includes a microlens array 110 and a coupling lens 160. The coupling lens 160 includes a first lens 162, a second lens 164, and a third lens 166.

The microlens array 110 includes multiple microlenses 112. The microlenses 112 are arranged in an array on one plane in a state in which optical axes of the microlenses 112 are parallel. For example, the microlenses 112 are arranged in a rectangular grid pattern.

The microlens array 110 according to the present embodiment includes a first microlens array 122 provided on the entrance side and a second microlens array 126 provided on the exit side. The first microlens array 122 is made of resin. The second microlens array 126 is made of glass. The first microlens array 122 includes multiple microlenses arranged in an array as a unit. Similarly, the second microlens array 126 includes multiple microlenses arranged in an array as a unit. The first microlens array 122 and the second microlens array 126 are bonded at an adhesive layer 129 with an adhesive for lenses, for example.

The microlenses in the first microlens array 122 and the microlenses in the second microlens array 126 respectively correspond to each other. Thus, one microlens in the first microlens array 122 and one microlens in the second microlens array 126 form one microlens 112. The lenses in the first microlens array 122 will be referred to as first microlenses 123, and the lenses in the second microlens array 126 will be referred to as second microlenses 127. Note that circles 180 in FIG. 1 represent regions of ineffective portions that does not function as lenses as designed owing to limitations in the processing accuracy, for example. Thus, the ineffective portions are larger as the circles are larger. Regions other than those with the circles 180 are effective portions that function as lenses as designed.

The first microlenses 123 are formed so that light beams incident on the first microlenses 123 enter the effective portions of the corresponding second microlenses 127 even if there are some manufacturing errors in the microlens array 126. Specifically, the first microlenses 123 each focusing light into the middle of the corresponding second microlens 127 are formed on the entrance side of the first microlens array 122. On the other hand, the second microlenses 127 are formed on the exit side of the second microlens array 126 so that pencils of rays each passing through one point on a first microlens 123 exit in parallel from the second microlens array 126. In other words, the first microlenses 123 and the second microlenses 127 have shapes optically symmetrical to each other. Since, however, resin and glass have different refractive indices, the first microlenses 123 and the second microlenses 127 have slightly different radii of curvature.

Figure 2:
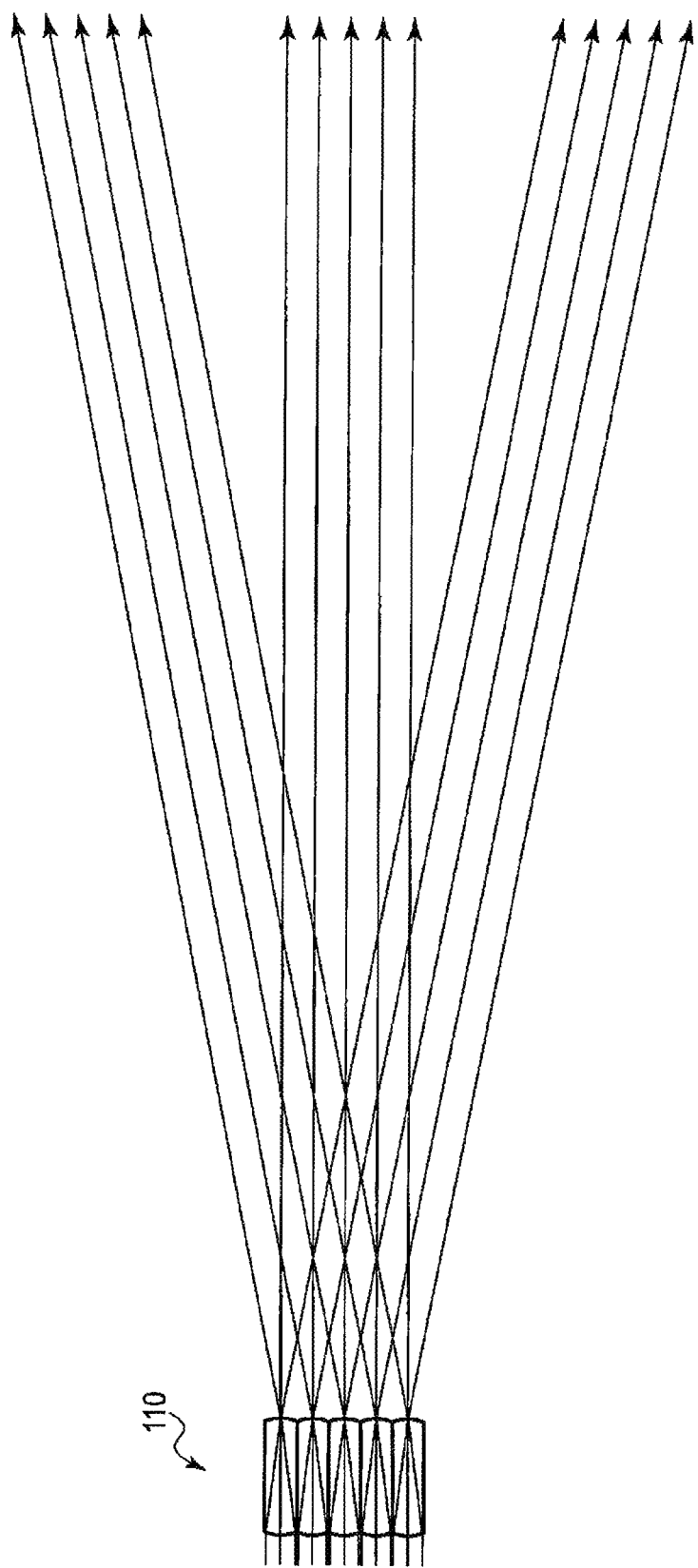
FIG. 2 is an explanatory view of an example structure of a microlens array according to the first embodiment.

The functions of the light intensity distribution uniformizing element 100 including the microlens array 110 according to the present embodiment will be described. An optical path of parallel light entering the microlens array 110 including the first microlens array 122 and the second microlens array 126 will be as illustrated in FIG. 2. Specifically, the exiting direction of light passing through the microlens array 110 is determined depending on the position on each microlens 112 where the light enters. As a result, the pencils of rays exiting the microlens array 110 are in a shape corresponding to the arrangement of the microlenses, that is, a rectangular shape similar to that of pencils of rays emitted from a light source at infinity.

In the present embodiment, as illustrated in FIG. 1, the coupling lens 160 is provided so as to focus light exiting the microlens array 110 onto an irradiation surface 170. Light rays incident on the microlenses 112 of the microlens array 110 are emitted to a predetermined area of the irradiation surface 170. As a result, the light intensity distribution at the irradiation surface 170 is a sum of intensity distributions of light rays exiting the microlenses. If the pitch of the microlenses 112 in the microlens array 110 is sufficiently small, the light intensity distribution at the irradiation surface 170 will be uniform independently of the light intensity distribution at the entrance surface of the microlens array 110.

As described above, the light intensity distribution uniformizing element 100 according to the present embodiment can make the light intensity distribution at the irradiation surface 170 uniform even when the intensity distribution of light incident on the light intensity distribution uniformizing element 100 is non-uniform.

The microlens array 110 according to the present embodiment includes the first microlens array 122 made of resin and the second microlens array 126 made of glass. The reason why these arrays are combined is as follows. Use of resin as a material like the first microlens array 122 facilitates mold making, for example, and can thus make the shape of the microlenses accurate. As a result, the effective portions that function as lenses become larger than the ineffective portions that do not function as lenses because of shape distortion or the like. Use of resin, however, leads to susceptibility to performance degradation due to heat. In contrast, use of glass as a material like the second microlens array 126 causes less performance degradation. Accurate processing, however, is difficult and ineffective portions are thus likely to be larger.

In the present embodiment, the ineffective portions of the first microlens array 122 are smaller than the ineffective portions of the second microlens array 126 as shown by the circles 180 in FIG. 1. Thus, with the microlens array 110 of the present embodiment, light incident on the first microlens array 122 can be used in a higher proportion than in a case where the whole microlens array 110 is made of glass.

The incident light focuses on the exit surface of the second microlens array 126. The second microlens array 126 is thus likely to become hot around the exit surface. Hence, the second microlens array 126 is more affected by heat than the first microlens array 122. In the present embodiment, the exit side of the microlens array 110 is formed of the second microlens array 126 made of glass, which makes the microlens array 110 less susceptible to thermal degradation than a case where the whole microlens array 110 is made of resin. Although the ineffective portions of the second microlens array 126 are larger than those of the first microlens array 122, the ineffective portions do not transmit light. Hence, the size of the ineffective portions does not affect the performance of the microlens array 110.

As described above, resin having smaller ineffective portions is used for the entrance side and glass excellent in heat resistance is used for the exit side, which realizes the microlens array 110 with good light use efficiency and excellent durability. Since light is focused in the second microlens array 126 made of glass, the present embodiment produces particularly advantageous effects. Focusing of light in the second microlens array 126 is advantageous in that the influence of errors in positioning of the microlenses of the first microlens array 122 and the microlenses of the second microlens array 126 is smaller.

Furthermore, since the first microlens array 122 and the second microlens array 126 are bonded to form the microlens array 110 as a unit, there is an advantage that the microlens array 110 can be easily treated when being mounted.

In the present embodiment, the microlens array 110 includes the first microlens array 122 and the second microlens array 126 that are bonded to each other. Alternatively, however, the first microlens array 122 and the second microlens array 126 may be provided separately. In this case, a non-reflective coating film may be provided between the first microlens array 122 and the second microlens array 126 or the entrance surface of the second microlens array 126 may be coated with a non-reflective coating to prevent light exiting the first microlens array from being reflected by the entrance surface of the second microlens array.

Furthermore, in the microlens array 110 illustrated in FIG. 1, the first microlens array 122 and the second microlens array 126 have substantially equal sizes. The ratio of the size of the first microlens array 122 to that of the second microlens array 126 may be any ratio.

Figure 3:
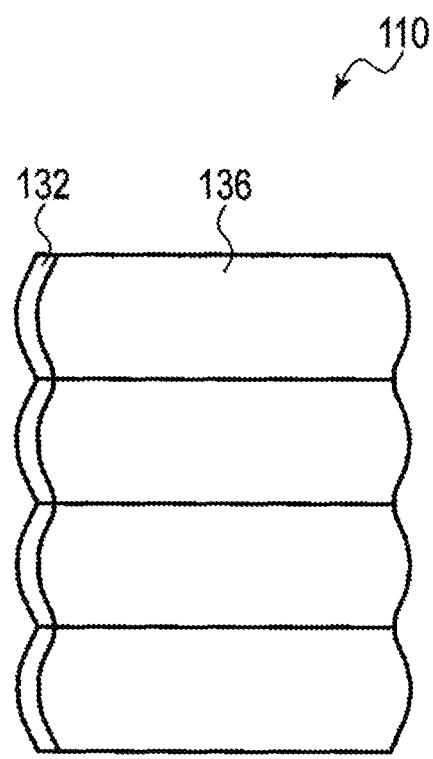
FIG. 3 is a schematic view of another example structure of a microlens array according to the first embodiment.

The microlens array 110 may thus be formed by placing a thin third microlens array 132 made of resin on a fourth microlens array 136 made of glass as illustrated in FIG. 3, for example. In this case, the microlens array 110 is produced by the following procedures, for example. First, the fourth microlens array 136 made of glass is formed similarly to common microlens arrays. Thereafter, the third microlens array 132 made of resin and designed to function similarly to the first microlenses 123 described above is formed on the entrance surface of the fourth microlens array 136. For the third microlens array 132, an ultraviolet curable resin or a thermosetting resin such as an epoxy resin is used. For the formation of the third microlens array 132, technologies for forming aspherical lenses can be applied, for example. With such technologies, manufacture of the microlens array 110 according to the present embodiment is relatively easy.

Although an example in which convexes are formed on the entrance surface of the fourth microlens array 136 is illustrated in FIG. 3, the entrance surface of the fourth microlens array 136 may be flat and only the coating layer 132 may have convexes functioning as lenses.

The microlens array 110 included in the light intensity distribution uniformizing element 100 can be used in various applications other than the light intensity distribution uniformizing element similarly to other typical microlens arrays. Although a case in which multiple microlenses 112 are arranged on a plane is presented in the present embodiment, the technologies of the present embodiment can also be applied to microlens arrays in which microlenses are arranged linearly such as in a row.

Second Embodiment

Figure 4:
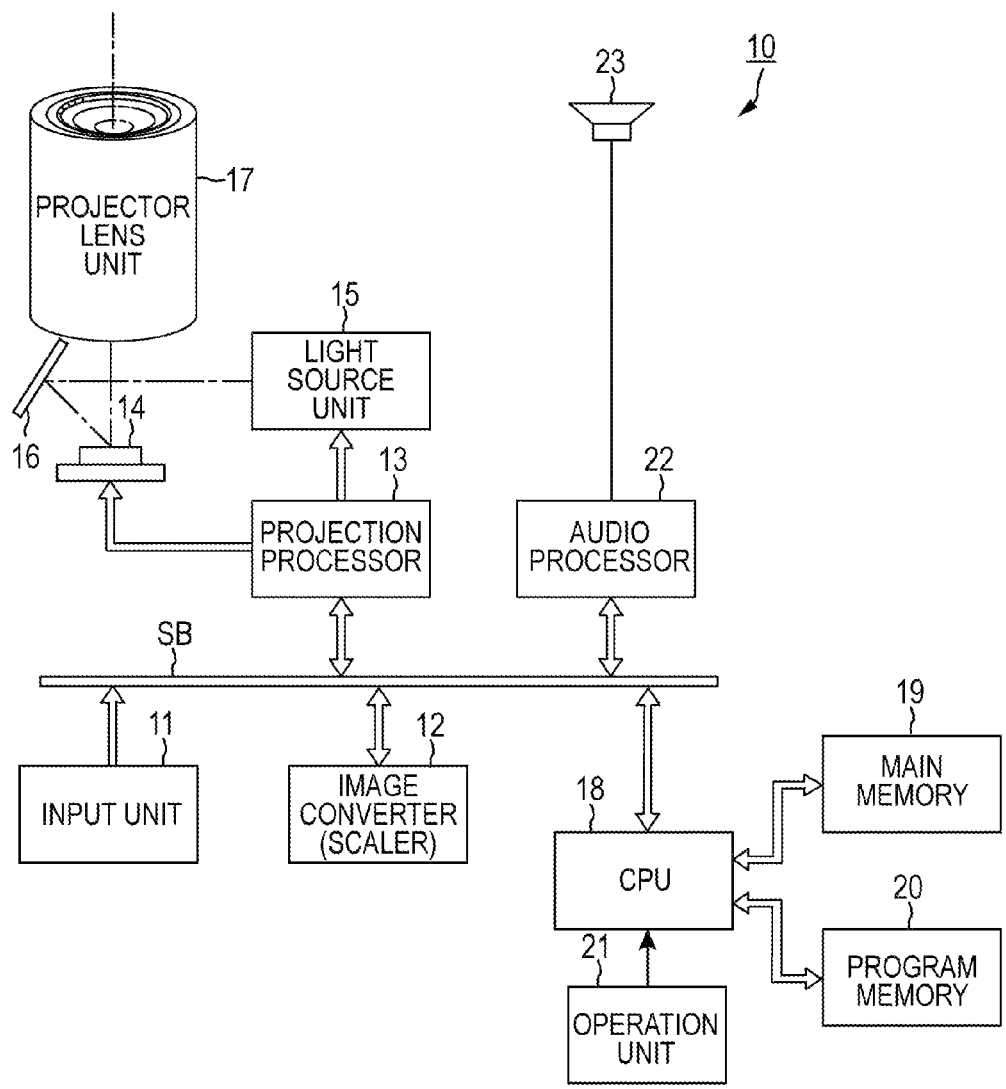
FIG. 4 is a schematic block diagram illustrating an example configuration of a projector according to a second embodiment.

A second embodiment will be described with reference to the drawings. The present embodiment is an embodiment of a projection apparatus in which the microlens array according to the first embodiment is used. FIG. 4 illustrates an outline of an example configuration of the projector 10 that is a projection apparatus according to the present embodiment. The projector 10 is a digital light processing (DLP) (registered trademark) projector using a micromirror display device. The projector 10 includes an input unit 11, an image converter 12, a projection processor 13, a micromirror device 14, a light source unit 15, a mirror 16, a projector lens unit 17, a CPU 18, a main memory 19, a program memory 20, an operation unit 21, an audio processor 22, a speaker 23, and a system bus SB.

The input unit 11 includes terminals such as a pin jack (RCA) type video input terminal and a D-sub 15 type RGB input terminal, and receives analog image signals as input. The input unit 11 converts the input analog image signals of various standards into digital image signals. The input unit 11 outputs the digital image signals obtained by the conversion to the image converter 12 via the system bus SB. The input unit 11 is also provided with an HDMI (registered trademark) and the like, and can receive digital image signals as input in addition to analog image signals. Furthermore, the input unit 11 also receives audio signals that are analog or digital signals. The input unit 11 outputs the input audio signals to the audio processor 22.

The image converter 12 is also referred to as a scaler. The image converter 12 is connected to the system bus SB. The image converter 12 converts the input image data into image data of a predetermined format suitable for projection, and sends the converted data to the projection processor 13. Where necessary, the image converter 12 sends image data on which symbols indicating various operation states for On Screen Display (OSD) as processed image data to the projection processor 13.

The light source unit 15 emits light rays of multiple colors including primary colors of red (R), green (G), and blue (B) under the control of the projection processor 13. The light source unit 15 is configured to emit light rays of multiple colors sequentially on a time division basis. Light emitted by the light source unit 15 is totally reflected by the mirror 16 and incident on the micromirror device 14.

The micromirror device 14 includes multiple micromirrors arranged in an array like a digital micromirror device (DMD; registered trademark). Micromirrors are rapidly switched on and off to reflect light emitted by the light source unit 15 toward the projector lens unit 17 and away from the projector lens unit 17. The micromirror device 14 has an array of micromirrors corresponding to WXGA (Wide eXtended Graphic Array) (1280 horizontal pixels× 800 vertical pixels), for example. The micromirror device 14 forms an image with WXGA resolution, for example, by reflection at the micromirrors. The micromirror device 14 thus functions as a spatial light modulation device.

The projection processor 13 is connected to the system bus SB, and drives the micromirror device 14 to display an image represented by image data sent from the image converter 12. Thus, the projection processor 13 switches the micromirrors of the micromirror device 14 on and off. Note that the projection processor 13 rapidly drives the micromirror device 14 on a time division basis. The number of divisions per unit time is a number obtained by multiplying a frame rate according to a predetermined format, such as 60 [frames/second], the number of divisions for color components, and the number of gradations for display. The projection processor 13 also controls operation of the light source unit 15 to synchronize with the operation of the micromirror device 14. Specifically, the projection processor 13 controls the operation of the light source unit 15 to divide frames into time slots and sequentially emit light of every color component for each frame.

The projector lens unit 17 adjusts light guided by the micromirror device 14 to light for projection onto an object onto which projection is made such as a screen (not illustrated), for example. Thus, an optical image formed by light reflected by the micromirror device 14 is projected and displayed onto the screen via the projector lens unit 17.

The audio processor 22 is connected to the system bus SB and includes an audio source circuit such as a PCM audio source. The audio processor 22 drives the speaker 23 to emit amplified sound on the basis of analog audio data input from the input unit 11 or on the basis of a signal obtained by converting digital audio data provided at the projecting operation into analog data. The audio processor 22 also generates a beep sound or the like where necessary. The speaker 23 is a typical speaker that emits audio on the basis of a signal input from the audio processor 22.

The CPU 18 is connected to the system bus SB, and controls operation of the image converter 12, the projection processor 13, and the audio processor 22. The CPU 18 is connected to the main memory 19 and the program memory 20. The main memory 19 is an SRAM, for example. The main memory 19 functions as a working memory for the CPU 18. The program memory 20 is an electrically rewritable nonvolatile memory. The program memory 20 stores operation programs to be executed by the CPU 18 and various format data. The CPU 18 is also connected to the operation unit 21. The operation unit 21 includes a key operation unit provided on the body of the projector 10 and an infrared ray receiving unit configured to receive infrared light from a remote controller (not illustrated) exclusively for the projector 10. The operation unit 21 outputs a key operation signal based on a key operation of the user at the key operation unit of the body or the remote controller to the CPU 18. The CPU 18 controls the operation of the respective components of the projector 10 in response to user's instruction from the operation unit 21 by using the programs and data stored in the main memory 19 and the program memory 20.

Figure 5:
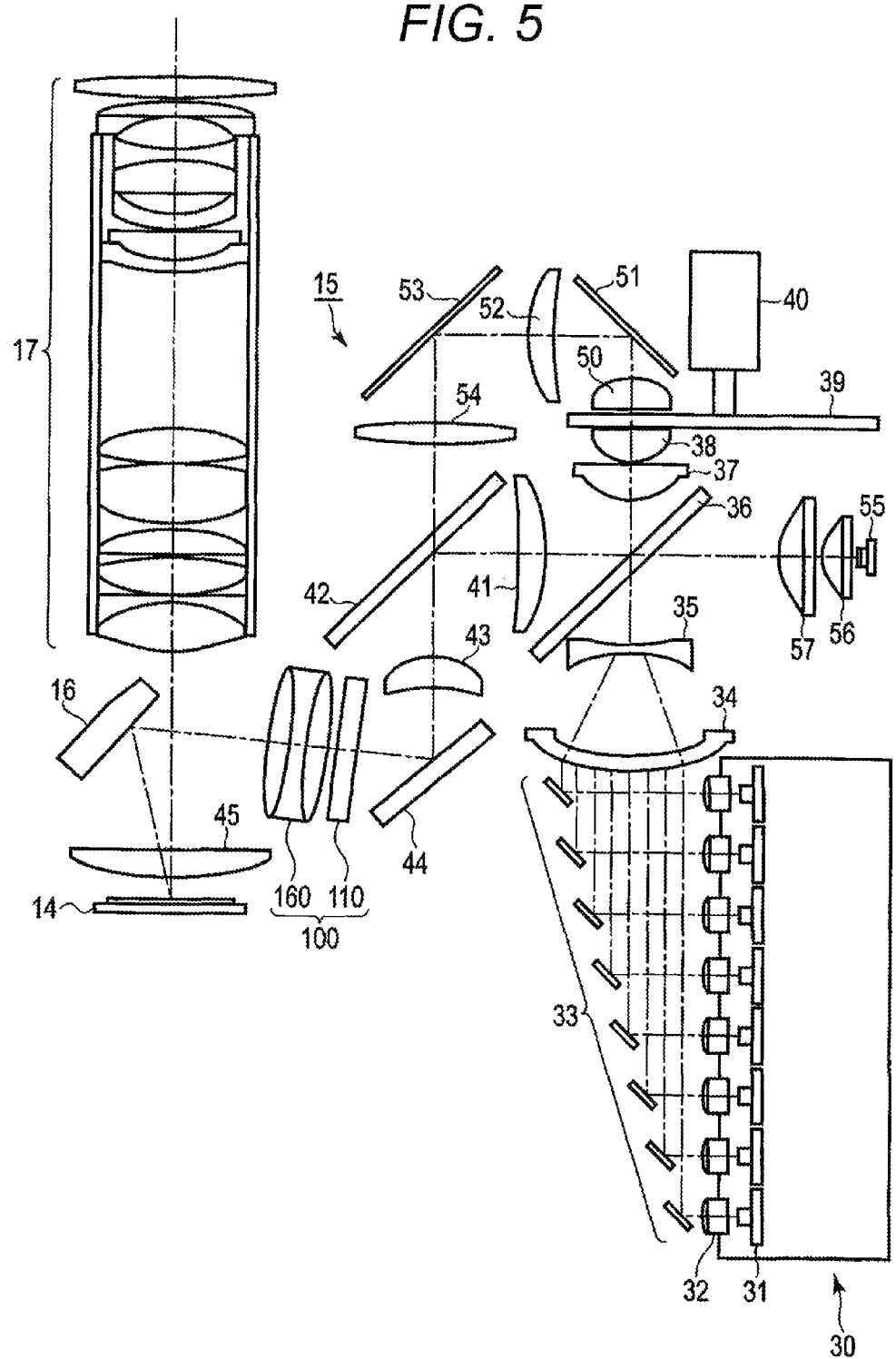
FIG. 5 is a schematic block diagram of an example of an optical system of the projector according to the second embodiment.

The optical system of the projector 10 according to the present embodiment including the light source unit 15, the mirror 16, the micromirror device 14 and the projector lens unit 17 will be described with reference to FIG. 5. The light source unit 15 is provided with a laser light source unit 30 having semiconductor lasers (laser diodes: LD) 31 that are semiconductor light emitting devices configured to emit blue laser light as a light source. The LDs 31 are arranged in an array in the laser light source unit 30. In the present embodiment, a total of 24 LDs 31 including 3 in row×8 in column are arranged in an array, for example. The blue laser rays emitted by the respective LDs 31 pass through collimator lenses 32 positioned for the respective LD 31 to become parallel rays, and are emitted from the laser light source unit 30.

Mirrors 33 are arranged like a staircase at positions facing the collimator lenses 32. The laser rays emitted from the laser light source unit 30 are reflected by the mirrors 33 to chance the optical paths by 90 degrees. The laser rays reflected by the mirrors 33 are focused into beams. The pencil of light is thus emitted by the laser light source unit 30.

On the optical path of the beams, lenses 34 and 35 and a first dichroic mirror 36 are arranged. The laser rays reflected by the mirror 33 are converted to parallel beams by the lenses 34 and 35, and are then incident on the first dichroic mirror 36. The first dichroic mirror 36 transmits blue light and red light but reflects green light. On the optical path of blue light transmitted by the first dichroic mirror 36, lenses 37 and 38 and a fluorescent wheel 39 are arranged. The blue light transmitted by the first dichroic mirror 36 is emitted to the fluorescent wheel 39 via the lenses 37 and 38.

The fluorescent wheel 39 has a disc-like shape. The fluorescent wheel 39 has two regions, one of which is provided with a diffuser for transmission and the other of which is provided with a phosphor layer. The region of the fluorescent wheel 39 with the phosphor layer is formed by applying phosphor to a surface onto which laser light from the laser light source unit 30 is incident. The phosphor emits green fluorescence when irradiated with blue light. A reflector is formed on the rear face of the phosphor layer. The diffuser of the fluorescent wheel 39 transmits and diffuses blue light. The fluorescent wheel 39 is driven and rotated by a motor 40 that is a rotary drive. The rotation is controlled together with the micromirror device 14 to synchronize with each other by the projection processor 13. During the control, the projection processor 13 detects rotation of a marker (not illustrated) formed on the fluorescent wheel 39 and uses the detection result.

Blue laser light incident on the phosphor layer of the fluorescent wheel 39 is emitted as green fluorescence. The green fluorescence is emitted isotropically. Fluorescence emitted toward the rear face of the phosphor layer is reflected by the reflector. The fluorescence emitted by the phosphor layer is thus guided toward the lenses 38 and 37. Green light transmitted by the lenses 38 and 37 is incident on the first dichroic mirror 36.

On the optical path of the green light reflected by the first dichroic mirror 36, a lens 41 and a second dichroic mirror 42 are arranged. The green light reflected by the first dichroic mirror 36 is incident on the second dichroic mirror 42 via the lens 41. The second dichroic mirror 42 transmits blue light and reflects red light and green light. On the optical path of green light reflected by the second dichroic mirror 42, a lens 43, a mirror 44, the light intensity distribution uniformizing element 100 according to the first embodiment, and the mirror 16 are arranged in this order. As described above, the light intensity distribution uniformizing element 100 is an element that includes the microlens array 110 and the coupling lens 160 and makes the intensity distribution of light beams uniform. The green light reflected by the second dichroic mirror 42 is incident on the light intensity distribution uniformizing element 100 via the lens 43 and the mirror 44. The green light is converted into a beam with uniform intensity distribution by the light intensity distribution uniformizing element 100 and incident on the mirror 16.

Meanwhile, the blue laser light emitted by the laser light source unit 30 passes the following path if the diffuser of the fluorescent wheel 39 is present on the optical path of the blue laser light. The blue laser light emitted by the laser light source unit 30 is incident on the diffuser of the fluorescent wheel 39 and is diffused and transmitted by the diffuser. On the optical path of the transmitted light, a lens 50, a mirror 51, a lens 52, a mirror 53, a lens 54, and the second dichroic mirror 42. The blue light transmitted by the diffuser is reflected by the mirror 51 via the lens 50, further reflected by the mirror 53 via the lens 52, and incident on the second dichroic mirror 42 via the lens 54. The blue light reflected by the second dichroic mirror 42 is incident on the light intensity distribution uniformizing element 100 via the lens 43 and the mirror 44. The blue light is converted into a beam with uniform intensity distribution by the light intensity distribution uniformizing element 100 and incident on the mirror 16.

The light source unit 15 has a light emitting diode (LED) 55 that is a semiconductor light emitting device configured to emit red light as a light source. On the optical path of the light emitted by the LED 55, lenses 56 and 57 and the first dichroic mirror 36 are arranged. The red light emitted by the LED 55 is incident on the first dichroic mirror 36 via the lenses 56 and 57. The red light transmitted by the first dichroic mirror 36 is incident on the second dichroic mirror 42 via the lens 41. The red light reflected by the second dichroic mirror 42 is incident on the light intensity distribution uniformizing element 100 via the lens 43 and the mirror 44. The red light is converted into a beam with uniform intensity distribution by the light intensity distribution uniformizing element 100 and incident on the mirror 16.

The green light, blue light, and red light reflected by the mirror 16 are emitted onto the micromirror device 14 via the lens 45. The micromirror device 14 forms an optical image by the light reflected toward the projector lens unit 17. The optical image is projected onto the screen (not illustrated) or the like via the lens 45 and the projector lens unit 17.

Operation of the projector 10 according to the present embodiment will be described. The following operation is executed by the projection processor 13 under the control of the CPU 18. The timing of emission by the LDs 31 for emitting blue light and the LED 55 for emitting red light of the laser light source unit 30, the timing of rotation of the fluorescent wheel 39 in synchronization with the emission timing, and the operation of the micromirror device 14 are all controlled by the projection processor 13.

An example in which three color rays of red (R), green (G), and blue (B) are incident on the micromirror device 14 will be described. At the timing at which red light is to be incident on the micromirror device 14, the LED 55 for emitting red light is turned on and the LDs 31 for emitting blue light are turned off. At the timing at which green light is to be incident on the micromirror device 14, the LED 55 for emitting red light is turned off and the LDs 31 for emitting blue light are turned on. At this point, the fluorescent wheel 39 is positioned by the rotation by the motor 40 so that the phosphor layer is on the optical path of blue light. At the timing at which blue light is to be incident on the micromirror device 14, the LED 55 for emitting red light is turned off and the LDs 31 for emitting blue light are turned on. At this point, the fluorescent wheel 39 is positioned by the rotation by the motor 40 so that the diffuser is on the optical path of blue light. As described above, the red light, green light, and blue light are sequentially made to be incident on the micromirror device 14 by controlling turning on/off of the LED 55 and the LDs 31 on/off and the angle of rotation of the fluorescent wheel 39 by the motor 40.

The micromirror device 14 guides incident light of each color for each micromirror (for each pixel) to the projector lens unit 17 for a longer time as the gradation based on image data is higher and for a shorter time as the gradation is lower. In other words, the projection processor 13 controls the micromirror device 14 so that a micromirror corresponding to a pixel with high gradation to be ON for a long time and that a micromirror corresponding to a pixel with low gradation to be OFF for a long time. In this manner, the gradation of each color of light emitted by the projector lens unit 17 can be expressed by each micromirror (pixel).

The gradations expressed by the times during which micromirrors are ON of the respective colors are combined for each frame to express an image. As described above, projection light expressing an image is emitted from the projector lens unit 17. The image is displayed on the screen or the like by projecting the projection light onto the screen.

Although an example of a projector using three colors of red light, green light, and blue light is presented in the above description, a projector may be configured to emit light of complementary colors such as magenta and yellow or white light and combine rays of these colors to form an image.

In the present embodiment, the microlens array 110 is provided so that light beams are perpendicularly incident thereon. Furthermore, the reflective surface of the micromirror device 14 and the irradiation surface 170 described with reference to FIG. 1 are coincident. With such a light intensity distribution uniformizing element 100, uniform light is emitted to the micromirror device. As a result, non-uniformity in the gradation in a projected image caused by the light source is resolved.

Although a case in which the light intensity distribution uniformizing element 100 is used in a projector is presented in the present embodiment, the application of the light intensity distribution uniformizing element 100 is not limited thereto. The light intensity distribution uniformizing element 100 according to the present embodiment can be used in various scenes where uniform light intensity distribution is required.

Furthermore, the invention is not limited to the embodiments described above but can be modified in various manners without departing from the scope of the invention in carrying out the invention. Moreover, the functions executed in the embodiments described above can be combined as much as possible as appropriate. The embodiments described above include various steps, from which various inventions can be extracted depending on the appropriate combinations of disclosed features. For example, if the effect can be produced without some of the features presented in the embodiments, a configuration without the features can be extracted as an invention.

What is claimed is:

1. A microlens array having multiple microlenses arranged axially parallel to one another, the microlens array comprising:
    a first microlens array in which a plurality of the microlenses are arranged on a plane, wherein entrance surfaces of the microlenses of the first microlens array on which light is incident are made of resin; and
    a second microlens array in which a plurality of the microlenses are arranged on a plane, wherein exit surfaces of the microlenses of the second microlens array from which light exits are made of glass,
    wherein the entrance surfaces are adapted to focus light rays entering the entrance surfaces onto the exit surfaces of the microlenses made of glass.

2. The microlens array according to claim 1, further comprising:
    an adhesive layer bonding the first microlens array and the second microlens array.

3. The microlens array according to claim 1, wherein the first microlens array is placed adjacent to the second microlens array such that an exit surface of the first microlens array faces an entrance surface of the second microlens array.

4. The microlens array according to claim 3, wherein the first microlens array is made of one of an ultraviolet curable resin and a thermosetting resin.

5. The microlens array according to claim 1, further comprising:
    a non-reflective coating layer provided between the first microlens array and the second microlens array.

6. A light intensity distribution uniformizing element comprising:
    the microlens array according to claim 1; and
    a lens adapted to focus light rays exiting the exit surfaces onto an irradiation surface.

7. A projection apparatus comprising:
    the light intensity distribution uniformizing element according to claim 6;
    a light source emitting light to be incident on the light intensity distribution uniformizing element; and
    a micromirror device provided on the irradiation surface and configured to form an optical image to be projected on an object by using light emitted from the light intensity distribution uniformizing element.

* * * * *